United States Patent [19]

Eng, Jr.

[11] Patent Number: 4,511,856
[45] Date of Patent: Apr. 16, 1985

[54] BOOTSTRAP POWER REGULATOR FOR SYSTEMS SUCH AS ANALOG TO DIGITAL CONVERTERS

[75] Inventor: Benjamin Eng, Jr., Everett, Wash.

[73] Assignee: John Fluke Mfg. Co., Inc., Everett, Wash.

[21] Appl. No.: 551,642

[22] Filed: Nov. 14, 1983

[51] Int. Cl.³ .............................................. H03F 3/04
[52] U.S. Cl. .................................... 330/297; 330/199; 330/127
[58] Field of Search ............... 330/297, 267, 262, 273, 330/199, 127

[56] References Cited

U.S. PATENT DOCUMENTS 4,378,530  3/1983  Garde .................................. 330/297

Primary Examiner—James B. Mullins
Assistant Examiner—G. Wan
Attorney, Agent, or Firm—Mikio Ishimaru; Stephen A. Becker

[57] ABSTRACT

A circuit for supplying regulated first and second supply voltages to the amplifier/comparator of a recirculation of remainder analog to digital converter, comprises a series pair of transistors connected as emitter followers between unregulated voltage sources. Outputs of the emitter followers carry the regulated supply voltages and are applied to the supply terminals of the amplifier/comparator. A pair of diodes connected in series between the bases of the emitter followers establish the magnitudes of the two regulated supply voltages. The junction voltage between the two Zener diodes is controlled by a difference amplifier that in turn is responsive to an analog input voltage and the output of the amplifier/comparator. The output of the difference amplifier causes the regulated supply voltages to track a common mode signal component inherent in the converter and thereby improves component accuracy. Another pair of Zener diodes between the output of the amplifier/comparator and the input to the difference amplifier prevents saturation of the amplifier/comparator by reducing the magnitude of the regulated supply voltages when the amplifier/comparator is in a comparator mode.

11 Claims, 7 Drawing Figures

BOOTSTRAP POWER REGULATOR FOR SYSTEMS SUCH AS ANALOG TO DIGITAL CONVERTERS

FIELD OF THE INVENTION

The present invention relates generally to analog to digital converters using recirculation of the remainder systems of the type disclosed in U.S. Pat. No. 3,703,002, granted to Richard Van Saun on Nov. 14, 1972 and the copending patent application Ser. Nos. 551,377, 551,589, 551,651, 551,712 and 551,713.

BACKGROUND OF THE INVENTION

In the past, analog to digital converters using recirculation of the remainder systems were difficult and expensive to build as production devices. The converters required many components and because of this the tolerance variations in the components caused accurate systems to be extremely expensive. Various components would have to be matched to reduce the affect of tolerance buildup and components which could not be matched would have to be manually adjusted by skilled technicians. Other components were required which were very accurate and had minimal variations from component to component. All of these factors contributed to a very expensive analog to digital converter.

In order to obtain five and a half digits accuracy, the converters required additional components above those described in the "Analog Digital Converter and Indicator Using Recirculation of Remainder" patent. U.S. Pat. No. 3,703,002. When increasing the accuracy of the Van Saun system, there are many undesirable effects such as the switch charge injection phenomenon, which can cause significant errors in high resolution and accuracy systems. With other components, for example the field effect transistor switches used in the Van Saun system, it was discovered that temperature variations during the use of the converter would introduce sufficient error to render the final systems inaccurate.

In the case of amplifiers, to obtain high accuracy, the amplifiers had to be individually manually adjusted, to customize the band width or the frequency response. To achieve a desired transient response, this manual adjustment meant, in some cases, adding or deleting capacitors while observing a waveform on an oscilloscope to achieve a specified response.

It further developed, that the previous methods of avoiding common mode rejection errors were insufficient to obtain high accuracies at low cost. When integrating the amplifiers, the theoretical common mode rejection ratio of 120 db was found not to be obtainable with conventional CMOS integrated circuit technology. Although computer analysis and simulations indicated the feasibility of amplifiers with 110 db common mode rejection ratio, in production, even in closely monitored production manufacturing situations, it was not possible to repeatedly obtain even acceptable yields of devices with such common mode rejection ratios.

With extensive experimentation, it was determined that the direction of current flow through a bilateral switches had a significant effect at the high levels of accuracy desired. The switches typically also had a temperature coefficient of one-half to six-tenths of a percent per degree centigrade, and this was sufficient to introduce inaccuracies in a device which had to work over a broad temperature range from zero to seventy degrees centigrade.

In examining the prior recirculation or remainder systems, it was determined that several follower amplifiers were required to charge the storage capacitors. To reduce cost, it is necessary to eliminate some of the follower amplifiers. Attempts at having a regular operational amplifier function as a follower amplifier were tried unsuccessfully.

Another problem with the prior art was that the existing amplifiers were not fast enough and to increase speed it was necessary to add additional amplifiers which resulted in the need for additional compensation to stabilize the amplifiers.

The additional amplifiers created additional problems in zeroing the converter circuitry. The various systems used in the past tended to have a multitude of offset errors due to the multitude of amplifiers. This made calibration to determine the zero values of the circuitry very difficult and time consuming.

The above problems appeared to be unsolvable and the technology was not advancing until a fortuitous accident. While one of a number of experimental breadboards was being tested, a wire broke. The breadboard with the broken wire had a huge offset, but the linearity was excellent. This resulted in the hindsight realization that undirectional switches would solve the switch problem and that changing the reference voltages on the A/D circuit would eliminate the amplifier problems. This eventually led to a simplification of the amplifier circuitry to a practical level by elimination of many components.

Evolving from the simplification effort, it was determined that one analog to digital amplifier could be made to perform several functions during different portions of the analog to digital conversion cycle. With an approach, the proper autozero technique was discovered to eliminate the huge offsets and to provide the desired output accuracy.

Still further, it was determined that prior art systems were subject to cardinal point errors where the digital output would undergo a discontinuity in tracking the analog input. Heretofore, this was considered an inherent aspects of the recirculating remainder analog to digital converter systems.

SUMMARY

The present invention provides a bootstrap power supply which tracks the input to the analog to digital converter to allow the use of lower grade components then previously believed possible while obtaining the same accuracy as in previous systems.

The present invention further provides a bootstrap power supply which limits the power supply to the analog to digital converter when its output exceeds a predetermined range.

The present invention further provides a bootstrap power supply which follows the input to the analog to digital converter so that converter never sees a common mode input signal (note above) while preventing the output from exceeding a predetermined range so that the converter may recover more quickly after it has been overloaded.

DESCRIPTION OF THE PREFERRED EMBODIMENT

Figure 1:
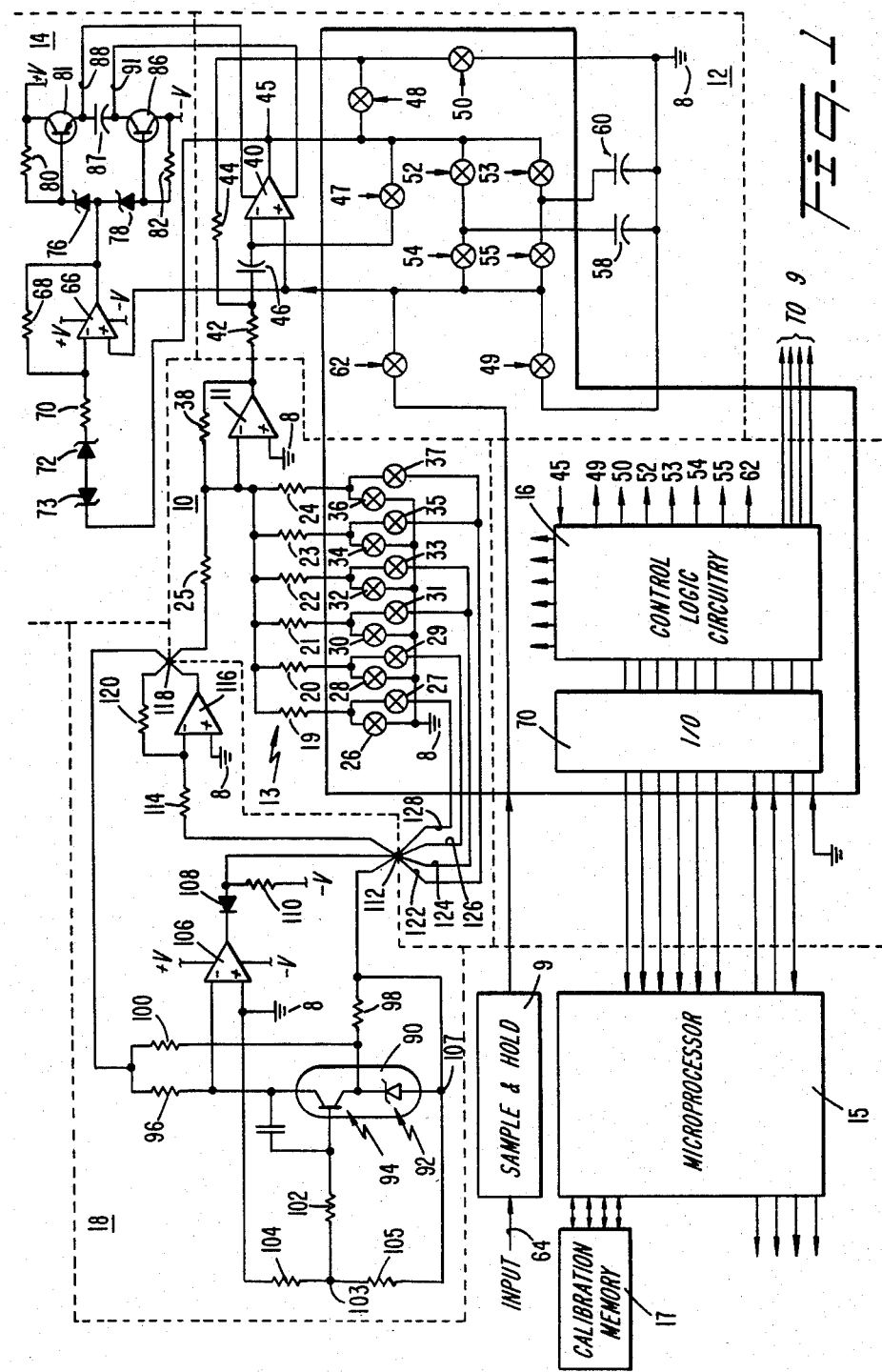
FIG. 1 is a schematic illustration, partially in block diagram form, of the preferred embodiment.

Referring now to FIG. 1 for an overview, therein is shown a conventional, commercially available sample and hold circuit 9 for inputting analog signals at controlled intervals. The sample and hold circuit 9 is connected to D/A converter circuitry 10 which outputs to A/D converter circuitry 12. The A/D converter circuitry 12 is powered from a bootstrap power supply 14. The D/A and A/D converter circuitry are controlled by control logic circuitry 16 directed by a conventional, commercially available microprocessor 15 which is connected to conventional calibration memory 17. The D/A converter circuitry 10 uses reference voltages, or potentials, from precision voltage reference circuitry 18.

The D/A converter circuitry 10 includes a D/A amplifier 11 with a ladder resistor network 13. The ladder resistor network 13 is made up of a plurality of ladder resistors, seven in the preferred embodiment, designated serially by the numbers 19 through 25. Each of the resistors has a value which is a multiple of the preceding resistor to make the resistors binary weighted. The ladder resistor network 13 at one end, is connected to the negative or inverting input of the D/A amplifier 11.

The other end of each of the ladder resistors in the network is connected to a pair of digital controlled ladder switches which are respectively, individually, designated by the numerals 26 through 37. The ladder resistor 25 is connected to the positive voltage of the reference circuitry 18 to provide a permanent offset to the potential at the inverting input of the D/A amplifier 11. Of each pair of ladder switches, the odd numerals 27, 29, 31, 33, 35, and 37 are connected to the negative voltage reference circuitry 18 while the even numerals 26, 28, 30, 32, 34, and 36 are connected to an analog common ground designated by the numeral 8. Disposed across the D/A amplifier 11 is a D/A gain setting resistor 38.

The output of the D/A amplifier 11 is connected to the A/D converter circuitry 12 and in particular has an operative connection to an A/D amplifier 40. The A/D comparator/amplifier 40 is bridged by an A/D gain setting resistor 44 connected to the output node 45. The A/D gain setting resistor 44 is connected at one end to an A/D input resistor 42, which is connected at its other end to the D/A amplifier 11 and to an autozero (AZ) storage capacitor 46 at the same end. The AZ storage capacitor 46 is further connected to the negative input of the A/D comparator/amplifier 40.

The negative input of the A/D comparator/amplifier 40 and the output of the A/D comparator/amplifier 40 is further bridged by a digitally controlled AZ switch 47 which is one of a group of switches which may be described as Amplifier control switches. A store 1 or store 2 switch 48 is disposed between the output of the A/D comparator/amplifier 40 and the A/D gain setting resistor 44. A digitally controlled "compare" switch 50 is connected to the junction between the store 1 or store 2 switch 48 and the A/D gain setting resistor 44 and connects the junction to the analog common 8 in its conductive condition.

The positive input of the A/D comparator/amplifier 40 is connected to a digitally controlled "AZ" switch 49. Bridging the positive input and the output of the A/D comparator/amplifier 40 are two pairs of digitally controlled switches, "store 1" switch 52 and "store 3" switch 54 in parallel with "store 2" switch 53 and "store 4" switch 55. Connected between the store 1 switch 52 and the store 3 switch 54 is a "A storage" capacitor 58 which is connected to the analog common 8. Between the store 2 switch 53 and the store 4 switch 55 is a connection to a "B storage" capacitor 60 which is further connected to the analog ground 8.

The main analog input over lead 64 is connected to the sample and hold circuit 9 and then via a digitally controlled "input" switch 62 to the positive input of the A/D comparator/amplifier 40.

The bootstrap (BS) power supply 14 is connected to the A/D converter circuitry 12 and includes a "BS follower" amplifier 66 which is bridged across its negative input and output by a BS follower resistor 68. The negative input of the BS follower amplifier is connected by a BS input limit resistor 70 and a pair of opposed limiting zener diodes 72 and 73 to the output of the A/D Amplifier 40. The positive input of the BS follower amplifier 66 is connected to the positive input of the A/D comparator/amplifier 40 and the input switch 62, store 3 switch 54, store 4 switch 55 and AUTOZERO switch 49.

The output of the BS follower amplifier 66 is connected between two supply setting zener diodes 76 and 78 which at their opposite extremities are connected to plus and minus bias resistors 80 and 82, respectively. The extreme ends of the bias setting resistors 80 and 82 are respectively connected to positive and negative source potentials. The junctions between the supply setting zener diodes 76 and 78 and the plus and minus bias resistors 80 and 82 are respectively connected to the bases of "supply follower" transistors 84 and 86, respectively. The supply followers 84 and 86 are disposed between the plus and minus source potentials. Disposed between the supply follower transistors 84 and 86 is a capacitor 87. The supply follower transistor proximate leads 88 and 90 are connected as the power supply of the A/D comparator/amplifier 40.

Referring now to the precision voltage reference circuitry 18, therein is shown a positive temperature coefficient zener diode 92 with a setable, opposing temperature coefficient emitter base junction of transistor 94. The transistor and zener are packaged in a single isothermal package generally designated as reference amplifier 90. The reference amplifier 90 has connected thereto a collector resistor 96. Zener current/source resistor 100 is connected from node 118 to cathode of zener node 90 and second zener current/source resistor 98 is connected between node 112 and cathode of zener 92.

The collector and base of the transistor 94 is bridged by a capacitor 101 and the base of the transistor 94 is further connected to a resistor 102. The resistor 102 is connected by a node 103 to a resistor network made up of resistors 104 and 105. The resistor 104 connects the resistor 102 to analog common 8, 106 and the resistor 105 connects the resistor 102 to a node 107 which is connected to the diode 92 and to the emitter distant end of the second emitter resistor 98.

The operational amplifier 106 has its positive input connected to the ground 8 and its negative input connected between the reference amplifier 90 and the collector resistor 96. The output of the operational amplifier 106 is connected to a diode 108. The diode 108 in turn is the regulated negative voltage source by a resistor 110 to a negative voltage reference output node 112. This negative output node 112 is further connected to the zener current source resistor 98 and the node 107.

The negative output node 112 is further connected to a resistor 114 which is connected in turn to the negative input of an operational amplifier 116. The positive input of the operational amplifier 116 is connected to the ground 8 and the output is connected to a positive voltage reference output node 118. The output node 118 is further connected by a gain setting resistor 120 to the negative input of the operational amplifier 116.

The negative output node 112, outside the precision voltage reference circuitry 18, is connected by lead 122 to the switches 35 and 37; by the lead 124 to the switches 31 and 33; by the lead 126 to the switch 29; and by the lead 128 to the switch 27. The positive output node 118 is connected by the ladder resistor 25 to the ladder resistor network 13 in the D/A converter circuitry 10.

The initial phase of operation includes a calibration phase which will be described later because it is easier to understand after the operation of the remainder of the system is understood.

The second phase of operation is the autozero phase during which the system is in a quiescent state with all the voltage levels fixed and no changes movement of any of the levels at any of the amplifier or resistor networks. During autozero, the autozero switches 47 and 49 are turned on. The autozero switch 49 connects the positive input of the A/D comparator/amplifier 40 to the analog common 8 and the autozero switch 47 connects the output thereof to the negative input proximate the A/Z storage capacitor 46. All the offsets from the D/A amplifier 11, the ladder resistor network 13, and the A/D amplifier/comparator 40 are imposed on the autozero storage capacitor 46. All of the other switches in the A/D converter circuitry 12 are off. The D/A amplifier/comparator 11 output is set to zero by turning on switches 27, 28, 30, 32, 34 and 36. Switches 26, 29, 31, 33, 35 and 37 are turned off.

The first operative phase of the analog to digital conversion begins when the microprocessor 15 provides directions to start the compare phase. During the compare phase, the analog input which is present at the sample and hold circuit 9 is applied to the positive input of the A/D comparator/amplifier 40 through input switch 62 which is turned on. Further, the compare switch 50 is turned on.

When the input signal is applied, the output of the D/A amplifier 11 will still be that of the analog common ground 8 and the analog input would cause the output of the A/D comparator/amplifier 40 to be at one extreme or the other depending upon the polarity of the analog input. It should be noted that the present invention is operative for the entire range of negative to positive polarity analog inputs without a need for sensing polarity.

After a trigger from microprocessor 15, the control logic circuit 16 will start opening and closing the digital switches 26 through 37 on and off to selectively connect the ladder resistors 19 through 24 into the connection between the input of the D/A amplifier 11 and the negative output node 112 or common 8.

The selective turn-on of the ladder switches 26 through 37 causes the output of the D/A amplifier 11 to start ramping in steps from minus full scale to plus full scale. At each step, the output of the A/D comparator/amplifier 40 operating in its comparator mode is checked for polarity. If polarity is positive, the particular ladder switch is left on and then the next switch is activated for the next resistor connection. If polarity is negative the particular switch is turned off, and the other switch of the pair is turned on to connect that resistor to the analog common ground 8.

In all cases, for both polarities of input, the current always flows through the ladder switches in the same direction. This is because it has been discovered that conventional bidirectional switches exhibit sufficient differences in resistance to current flow in different directions to cause noticable errors in high precision instruments of the type embodying the current invention.

As each of the resistors in the ladder resistor network 13 is tried, the control logic circuit 16 remembers which of the ladder resistors is left connected to the negative output node 112.

Since the ladder resistors are binary weighted, each of the resistors selected during the above process represents the closest digital equivalent of the analog input at the positive input of the A/D comparator/amplifier 40. The output of the A/D comparator/amplifier 40 is thus below the next complete digit and may be termed a "remainder". In this fashion, the first digit is determined and the portion of the input signal representative thereof is subtracted from the positive input to the A/D comparator/amplifier 40.

To store the remainder being outputted from the A/D comparator/amplifier 40 the compare switch 50 is turned off and the store 1 or store 2 switch 48 is turned on. The input switch 62 is left on and the store 1 switch 52 is turned on to connect the output of the A/D comparator/amplifier 40 to the A storage capacitor 58.

During this next phase, the A/D comparator/amplifier 40 is no longer used as a comparator and instead is used as an amplifier. In the amplifier mode, inputs to the positive input of the A/D comparator/amplifier 40 are multiplied by a predetermined factor. In the preferred embodiment, the predetermined factor that the remainder is multiplied by is 16.

The amplified output then charges the A storage capacitor and a time delay is provided to allow the A/D comparator/amplifier 40 to stabilize after charging the A storage capacitor 58. Then the store 1 switch 52 is turned off. Finally, the input switch 62 is also turned off to complete this amplifier or remainder storage phase.

In the next phase, the A/D comparator/amplifier 40 is then reconfigured into its comparator mode. The compare switch 50 is turned on and the store 1 or store 2 switch 48 is turned off. With the store 3 switch 54 turned on, the compare phase cycle is restarted. The charge that was stored on the A storage capacitor 58 now replaces the original analog signal as the input to the positive input of the A/D comparator/amplifier 40.

As before, the ladder switches are opened and closed by the control logic circuit 16 and the A/D amplifier/comparator 40 in its comparator mode is monitored for its output polarity. If a particular ladder switch causes the output polarity to be negative, that particular switch is removed from the connection to the negative output node 112. After each of the six ladder switches have been tried, those resistors that remain connected to the precision voltage reference circuitry 18 represent the digital equivalent of the analog voltage which is the predetermined number of times the remainder from the previous compare phase. It is in this fashion that the first significant bits of the remainder are determined.

The circuit is then switched so that the A/D comparator/amplifier 40 is changed into the amplifier mode. The compare switch 50 is turned off and the store 1 or store 2 switch 48 is turned on. The store 3 switch 54 is left on and the input from the D/A amplifier and the potential from the A storage capacitor 58 is applied to the positive input of the A/D comparator/amplifier 40. The difference between the output of the D/A amplifier and the charge from the A storage capacitor 58 is multiplied by the predetermined factor and appears at the output node 45.

During this phase, the potential at the output node 45 is applied to the B storage capacitor 60 through the store 2 switch 53. After a sufficient time delay for the A/D comparator/amplifier 40 to stabilize, the store 2 switch 53 is opened and the charge across B storage capacitor 60 represents the predetermined number times the difference between the D/A output and the charge previously on the A storage capacitor 58. This time, however, the digital information representing the ladder bits which were called during the last compare phase are equal to one-sixteenth the values represented by the same bits when they were called during the first compare phase. Now, the compare phase and the amplification phases are repeated; the compare phase is repeated three times and the amplification phase twice.

Each time the compare and amplification phases are repeated, the role of the A and B storage capacitors 58 and 60, respectively, are exchanged.

During each compare mode when the last one or two ladder switches are tested, it is possible for the comparator mode connected A/D Amplifier/Comparator 40 to be not settled and to have its output polarity incorrectly interpreted by the control logic circuitry 16. This situation will cause a ladder switch to be incorrectly selected and the final digital representation of the analog input to be in error. The point where comparator errors are most likely to appear is at the cardinal points or points where the input voltage level is very near the value where there are major changes of ladder switch patterns, such as 101111 to 110000.

In the original recirculation of the remainder system, if the ladder switch is selected incorrectly such that its corresponding analog level is slightly larger than the applied input, the final digital result will be in error by the difference and in most cases, the A/D converter will have some missing values or codes near cardinal points.

Generally a cardinal point is most noticeable between two closely spaced readings which result in major changes of ladder switch patterns. In the past, any mismatch of ladder switches or resistors caused major discontinuities in th linearity curve. For example, for equally spaced increments of input voltage, successive digital readings might be:

| Desired | Actual |
|---------|--------|
| 09995 | 09995 |
| 09996 | 09996 |
| 09997 | 09997 |
| 09998 | 09997 (Discontinuity) |
| 09999 | 09997 (Discontinuity) |
| 10000 | 10000 |
| 10001 | 10001 |
| 10002 | 10002 |

In the present invention the cardinal point errors are eliminated because of a self correction scheme embeded in the topology of the circuit. In the preferred embodiment, the equivalent value of the ladder resistors 19 through 24 are weighted sixteen to one. There is also the ladder resistor 25 which has a negative sixteen weight to start the binary digits from a negative (or offset) value. This means switch 26 on will result in zero output from the D/A amplifier 11. With six switches, the switch patterns of each recirculation overlap by two. Thus, if an error is made during one of the recirculations of the remainder, the error is added to the remainder and affects the switch pattern in the next recirculation to be cancelled or substracted out.

After all the phases are completed, a register in the control logic circuit 16 has a binary representation of the analog signal that was applied at the input 64. This binary data is then shifted out six bits at a time serially onto an interface bus, to be later described, that is connected to the microprocessor 15. The microprocessor 15 then rearranges the data and inserts the appropriate correction factors to correct for errors due to the ladder resistor network 13, the various switches in the A/D converter circuitry 12, and the voltages from the precision voltage reference circuitry 18.

While the data is being transferred form the control logic circuit 16 through the bus interface 70, the A/D converter circuitry 12 is placed back in its autozero phase.

The BS power supply 14 enhances the performance of the A/D amplifier/comparator 40 by generating a power supply which tracks the input to the A/D comparator/amplifier 40. It also serves to limit the output excursion of the A/D comparator/amplifier 40 when it is used in the comparison mode.

When the A/D comparator/amplifier 40 is in the autozero phase or in the amplifier phase, the bootstrap follower amplifier 66 is connected as a follower. The output of the BS follower amplifier 66 tracks the voltage at its positive input. Th positive input of the BS follower amplifier 66 is connected to the positive input of the A/D comparator/amplifier 40. The output of the BS follower amplifier 66 is connected at the junction of the two zener diodes 76 and 78. These two zener diodes 76 and 78 set the operating points for the plus and minus supply follower transistors 84 and 86, respectively. The transistors 84 and 86 are set up so as to provide a bootstrap power supply via leads 88 and 90 to the A/D comparator/amplifier 40. Thus, the bootstrap power supply 14 provides a power supply that bootstraps on tracks the A/D amplifier/comparator 40 inputs so it never sees a common mode input signal. This makes it feasible to use a lower grade amplifier than heretofore believed possible for the A/D comparator/amplifier 40.

When the A/D comparator/amplifier 40 is used in the comparator mode, its output is driven to supply extremes in either polarity depending on the input signal. When this occurs, the output devices in the amplifier become saturated and do not recover in time to perform as a linear amplifier when the circuit is changed into an amplifier. Therefore, the bootstrap power supply 14 includes components so that it can limit supply voltages and thus limit the output excursions of the A/D comparator/amplifier 40 to make it recover more quickly after it has been overloaded during the compare phase. This is accomplished by resistor 70 and two zener diodes 72 and 73, connected back to back which are connected between the negative input to the BS amplifier 66 and the output of the A/D comparator/amplifier 40.

When the output of the A/D comparator/amplifier 40 exceeds a predetermined level, the zener diodes break over and convert the configuration of the bootstrap follower amplifier 66 from a follower mode into an operational mode and thus it becomes an inverting amplifier. As an inverting amplifier, the bootstrap amplifier 66 limits the output of the A/D comparator/amplifier 40 by limiting its power supply. This limiting of the output level of the A/D amplifier/comparator 40 makes it possible for the amplifier to very quickly return to its linear mode of operation during the amplifier phase.

The precision reference voltage circuitry 18 provides a positive and negative reference voltage source which has excellent long-term stability, small temperature coefficient, and is presettable to a desired output voltage without production manual adjustments.

The reference amplifier 90 and the collector resistor 96 are selected to set the current through transistor 94 such that the temperature coefficient of the emitter base voltage of transistor 94 is exactly equal to the temperature coefficient of the zener diode 92. The net temperature coefficient of the zener diode 92 and the base emitter voltage of the transistor 94 is zero for the voltage between the nodes 103 and 107.

The reference amplifier 90 provides the needed voltages to properly bias the operational amplifier 106 and to scale the stable voltage between nodes 103 and 107 to desired voltage levels between the analog common ground 8 and the negative output node 112. The operational amplifier 106 is an active device that controls negative voltage levels at the negative output node 112. The resistor network made up of the resistors 104 and 105 also set up the desired output voltage between the analog ground 8 and the negative output node 112. The diode 108 and the resistor 110 ensure that the output at the negative output node 112 is always negative.

The portion of the precision reference voltage circuitry 18 which outputs a positive precision reference voltage at the positive output node 118 consists of the operational amplifier 116 and two gain setting resistors 114 and 120. This circuit provides the desired positive output and it is the stable source for setting the required zero temperature coefficient current for the reference amplifier 90 via the resistor 96.

The positive and negative output voltages provide the precise voltage levels needed to set the desired current for the reference zener diode 92 via resistors 98 and 100.

In effect, the reference amplifier 90 can be considered part of an operational amplifier. The base of the reference amplifier transistor 94 and the resistor 102 is the non-inverting input and the emitter of the reference amplifier transistor 94 is the inverting input. Diode 108 and resistor 110 with amplifier 106 make up the output portion of the operational amplifier.

Essentially, the output voltage at the negative output node 112 would be more negative than the node 103 by the voltage across the zener diode 92 plus the offset voltage of the operational amplifier. The effective operational amplifier will have an input offset voltage that has an adjustable temperature coefficient set by the selection of the value of the collector resistor 96. The zener diode 92 has a positive temperature coefficient and so the equivalent operational amplifier will have an adjustable negative temperature coefficient. Thus, with proper selection of the collector resistor 96 during testing of the reference amplifier 90, the voltage between the base of the transistor 94 and the negative output node 112 will be a temperature and time independent stable voltage.

The voltage at the negative output node 112 with respect to the analog common ground 8 can be adjusted to any level larger than the voltage across the zener diode 92 plus the voltage across the base emitter junction of the reference transistor 94. Since the resistors 104 and 105 are in one precision network, the division can be made very stable.

The positive reference voltage at the positive output node 118 is generated with an inverting amplifier using a gain of minus one. The gain is set up by the ratio of the two resistors 114 and 120 which are in one network and which can be made very stable. The voltage offset and the voltage temperature coefficient can cause some errors, but for this (A/D) application, the errors are negligible.

In actual production, it has been found that the precision voltage reference circuitry 18 is unique for several reasons. First, the output voltage of the circuit can be very precisely set by laser trimming the resistor network consisting of the two resistors 104 and 105 during testing of the reference amplifier 90. The collection of components then can be installed in a larger system without the requirement of manually selecting resistors or adjusting a control. Second, the circuit places the reference amplifier 90 in an electrical environment that duplicates the environment in which the device was originally tested. The resistor 102 makes the resistance looking away from the base appear to be the same as that in a test environment. The resistors 98 and 100 make the source resistance for the zener current for the reference zener 92 to be the same as in the test environment, and third, the complete circuit can be built using only seven components.

Figure 2:
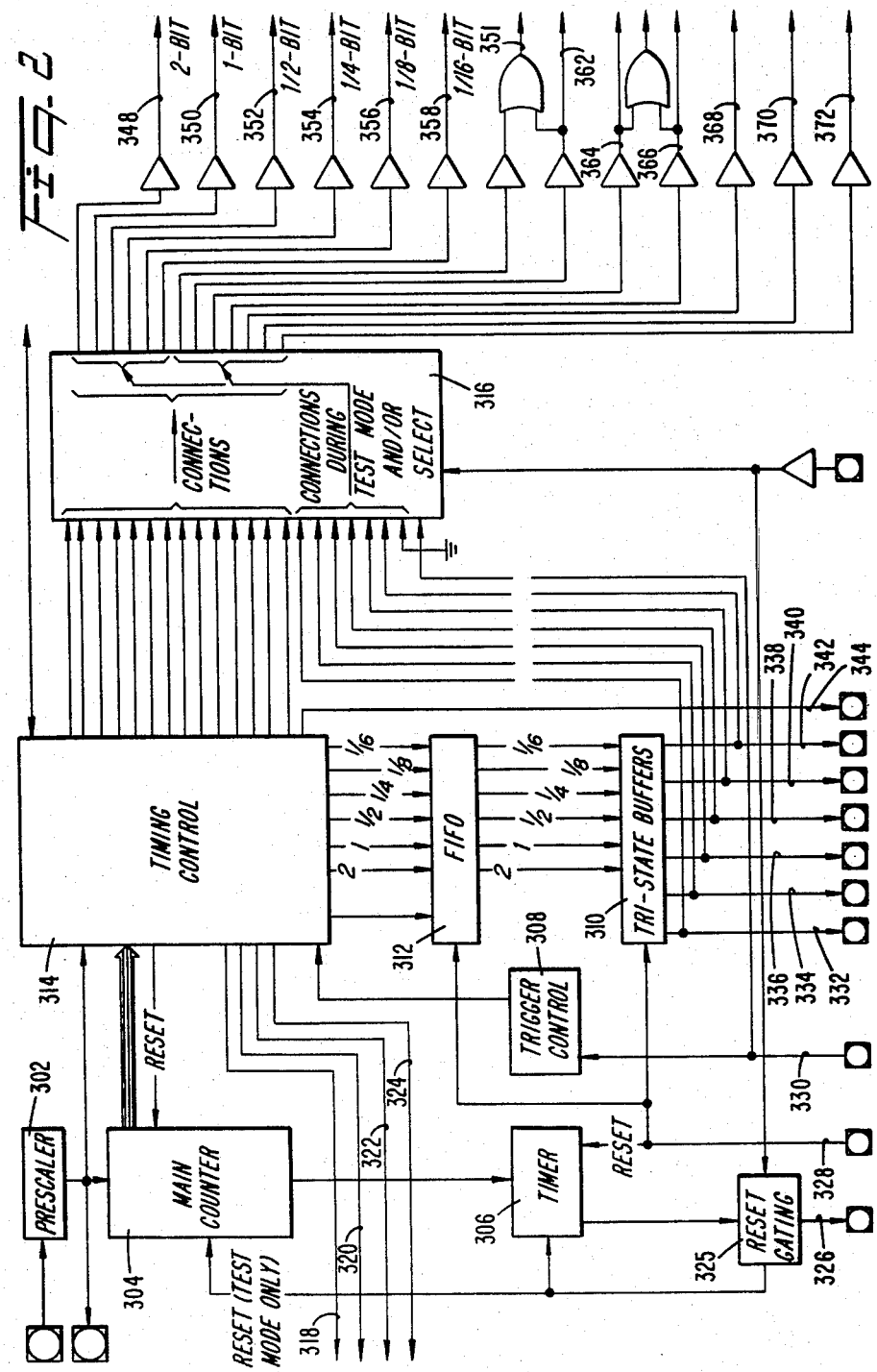
FIG. 2 is a schematic illustration, partially in block diagram form, of a portion of the remainder of the preferred embodiment of the present invention.

Referring now to FIG. 2, therein is shown the contents of the block designated as the control logic circuitry 16.

A prescaler 302 receives a set frequency input signal from the instrument (not shown) containing the A/D converter. The signal is provided to a main counter 304. The main counter 304 is connected to a watchdog timer, 306.

The main counter 304 is further connected to a timing control 314 which provides signals (according to the timing diagram to be hereafter described) to a first-in first-out (FIFO) register 312 which forwards signals to tristate buffers 310. Connected to the timing control 314 is an "and/or select" logic 316. Where not otherwise designated, these are all conventional components assembled in well-known configurations or would be obvious to those skilled in the art from the description. The timing control 314 further has output leads 318, 320, 322, and 324 connected to a sample and hold circuit 9 (shown in FIG. 1).

The main counter 304 is still further connected to watchdog timer 306 that is used to check to make sure that microprocessor 15 interogates the system periodically and, if it does not, it will be assumed that the microprocessor program counter has lost its place and will cause the microprocessor 15 to reset thus initializing the software and the A/D status to a known state.

The watchdog timer 306 is connected to a reset gating circuit 325 (for resetting the microprocessor 15 as described above) and to a lead 326 to the bus interface 70. The bus interface 70 is connected by a lead 328 to the watchdog timer 306. The bus interface 70 is further connected by a lead 330 to the trigger control 308 and is connected by leads 332, 334, 336, 338, 340, and 342 from the tristate buffers 310. Each of these leads is individually connected from the tristate buffers 310 to the and/or select logic 316. A lead 344 connects the timing control 314 to the bus interface 70 and a lead 346 connects the timing control 314 to the output node 45.

The and/or select logic 316 is connected by leads 348, 350, 352, 354, 356, and 358 to the ladder switches 26, 28, 30, 32, 34, and 36, respectively (shown in FIG. 1). The and/or select logic 316 is further connected by lead 360 to the compare switch 50 and by the lead 362 to the autozero switch 47 and 49. The and/or select logic 316 is further connected by leads 364, 365, 366, 370 and 372 respectively to the amplifier control switches 52, 48, 53, 54, and 55. A lead 368 is connected to the input switch 62.

In order to understand the operation of the entire analog to digital converter, it is necessary to reference the flow chart in FIG.'S 3, 4, and 5, sequentially, and the wave form diagrams of FIG.'S 6 and 7 simultaneously.

Initially, the A/D converter is in a standby state in which the output signals on leads 318 and 320 are on, the signals on leads 322 and 324 are off, and the autozero mode is in effect. In the autozero mode, there are signals on leads 348 for the ladder switch 26 and the lead 362 for the autozero switch 47 and 49 and no signals on: the leads 350, 352, 354, 356, and 358 for the other ladder switches; the lead 360 to the compare switch 50; and the leads 364, 366, 368, 370, and 372 which are for the amplifier control switches.

Figure 6:
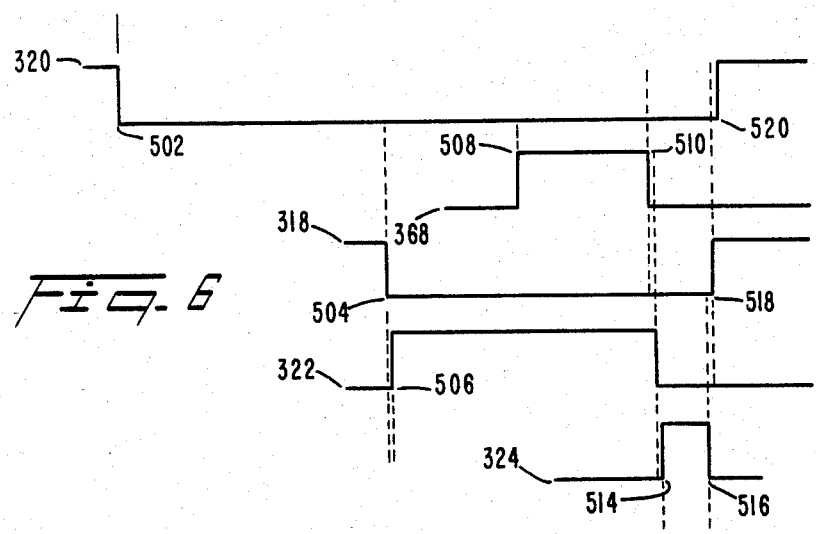
FIG. 6 is a portion of the timing diagram of the signals which control the present invention.

After the triggering input is provided as indicated by the decision block 402, the output on lead 320 is turned off as shown at block 404. Next, a predetermined period of time passes as shown by delay block 406 before the signal on lead 318 is turned off and the signal on lead 322 is turned on by the timing control 314. With reference to FIG. 6 which is a timing diagram which depicts the various wave forms imposed on leads 318, 320, 322, and 324, it may be seen that the wave forms change at points 502, 504, and 506.

After the predetermined delay as indicated by block 410, the autozero mode is turned off as indicated by block 412. The wave forms involved are shown at points 522 and 508 in FIG. 7. As a point of reference, it should be noted that the points 508 and 510 are identical in FIG.'S 6 and 7.

Figure 5:
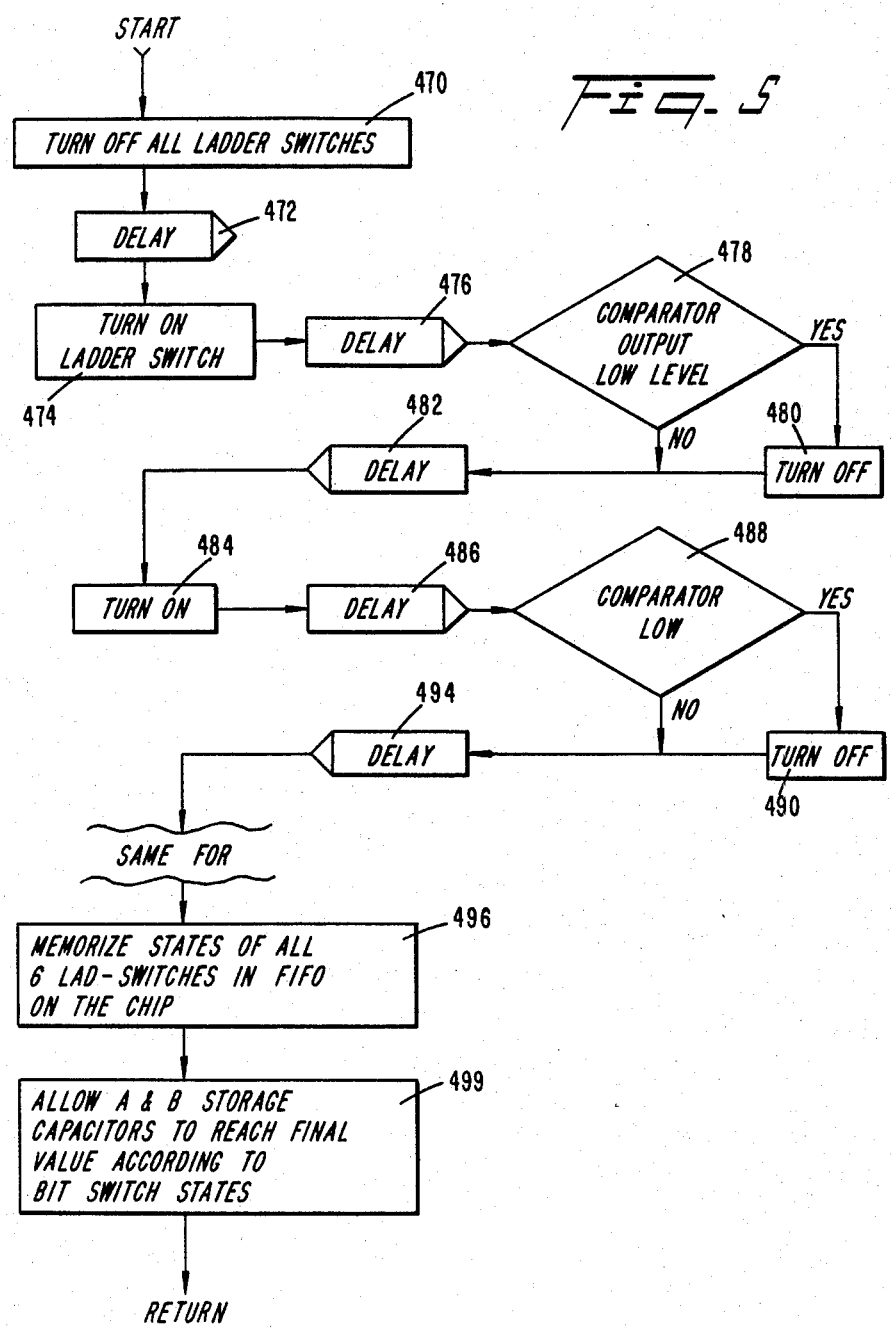
FIG. 5 is a subroutine used in the flow charts shown in FIGS. 3 and 4.

Next, the input mode is turned on as indicated by block 414 as the input switch 62 remains closed between points 508 and 510. While the input mode is turned on, the digit selection process (process by which the bits which make up the digit are selected) indicated by block 416 is implemented. This is a subroutine which is shown in FIG. 5 and which will be discussed in greater detail later.

Figure 7:
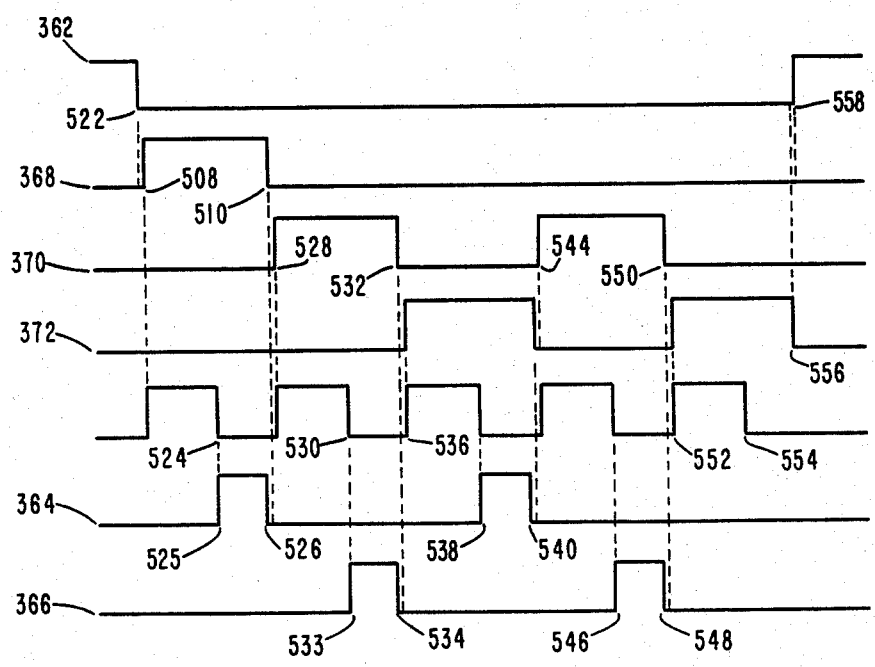
FIG. 7 is the remainder of the timing diagram of the signals which control the present invention.

When the digit selection process is completed, the input mode is turned off as indicated by block 418 and at point 510 in FIGS. 6 and 7.

Next, the A capacitor mode is activated by turning on the switch 54 at the point 528 in FIG. 7.

After the A capacitor switches are turned on, a pair of simultaneous processes occur. The first process is the digit selection process of block 438, which is the subroutine shown in FIG. 5, repeated. The second process which relates to the sample and hold circuit 9 begins with a predetermined time delay as indicated by block 422 after which the signal on the 322 is turned off as shown by block 424 and point 512 in FIG. 6. Another predetermined delay occurs at block 426 and then the signal on lead 324 is turned on in block 428 as indicated at point 514 in FIG. 6. The signal remains on for a predetermined period as indicated by block 430 and then it is turned off at block 432 and point 516. After a further time delay indicated by block 434, the signals on leads 318 and 320 are turned on as indicated by block 436 and the points 518 and 520 which occur shortly thereafter.

It should be noted from the dotted lines in FIG.'S 6 and 7 that the signals are not turned on and off simultaneously but rather are generally staggered so that one signal will terminate before another begins. This "break before make" has contributed to system accuracy by eliminating error inducing transients.

By the time the block 436 occurs, the digit selection process of 438 will be completed and the program will proceed to block 440 where the A capacitor switches will be turned off with switch 54 being turned off at point 532. Next, the B capacitor mode is activated as indicated by block 442 and point 536.

Next, the digit selection process is repeated for the remaining remainder as indicated by block 444.

After completion of the digit selection process in block 444, the B capacitor switches are turned off as indicated by the block 446 and the A capacitor switches are turned on as indicated by block 448 and then the digit selection process is repeated for the remaining remainder as indicated by block 450.

After completion of the bit selection process, the A capacitor switches are turned off as indicated by block 452 and the B capacitor switches are turned on as indicated by block 454. Next, the digit selection process is repeated as indicated by block 456 and then the B capacitor switches are turned off as indicated by block 458.

During the capacitor charging process the remainder value is being stored. This remainder value storage occurs four times between wave form points 524 to 526, 533 to 534, 538 to 540, and 546 to 548.

At that point, the autozero is turned on as indicated by block 460 and point 558.

The digit selection process could continue to be repeated for additional digits; however, at this point in the preferred embodiment the autozero is turned on as indicated by block 460 and point 558.

Figure 3:
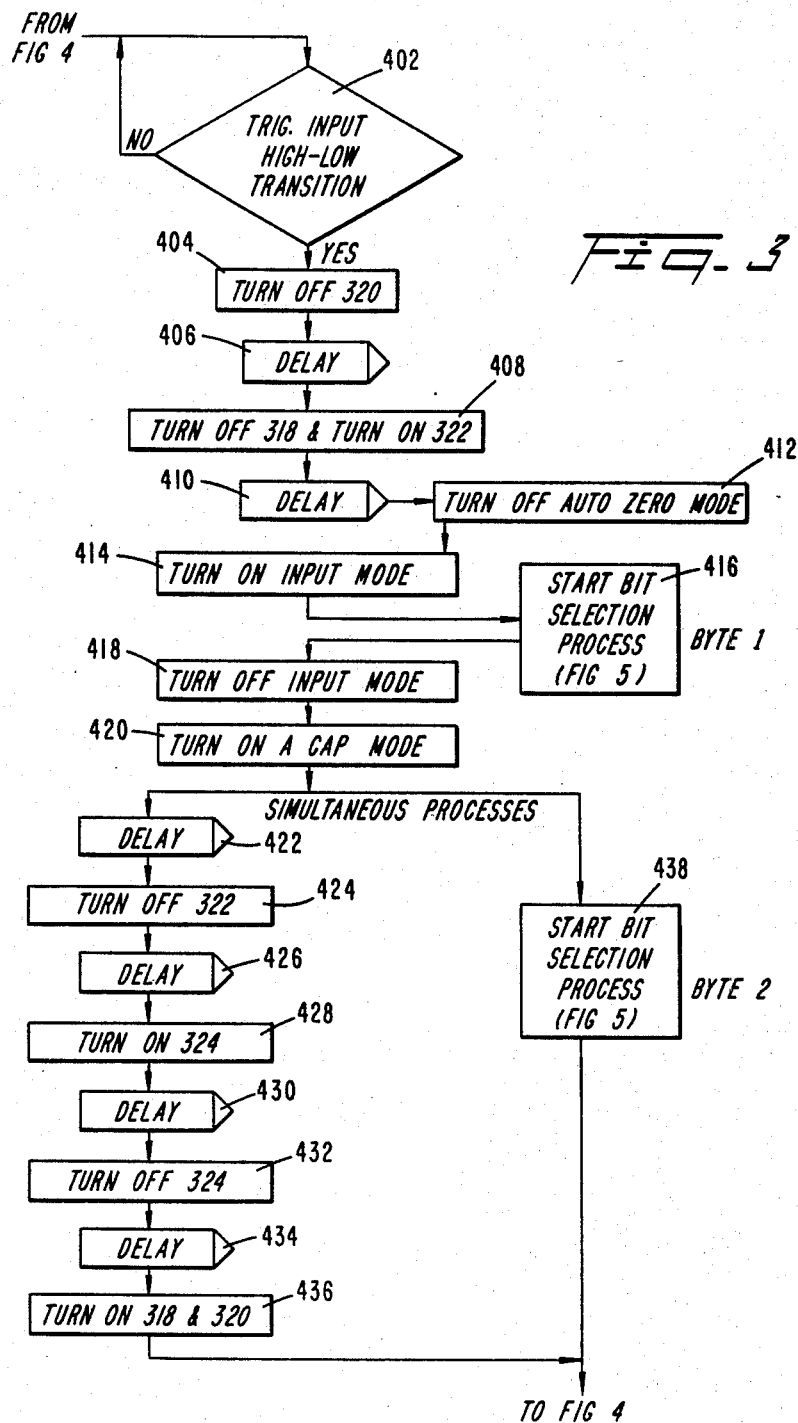
FIG. 3 is a portion of a flow chart of the control program of the present invention.
Figure 4:
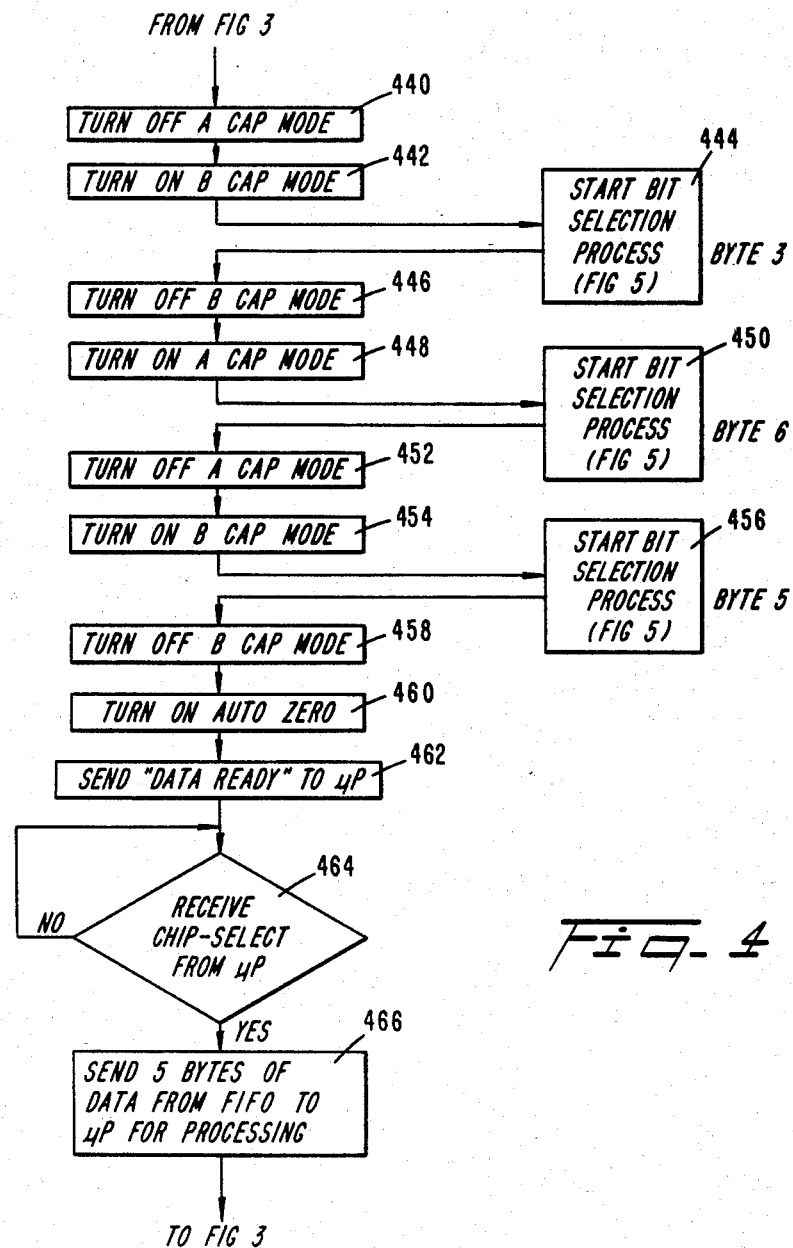
FIG. 4 is the remainder of the flow chart of the control program of the present invention.

Next, a "dataready" signal is sent to the microprocessor 15 as indicated in block 462. When the "dataready" signal is received as indicated by the decision block 464, the control 314 and logic circuit 16 sends 5 bytes of data from the FIFO buffer 312 to the microprocessor 15 for processing 466 and the program returns to the decision block 402 in FIG. 3 to recycle the system for the next analog to digital conversion.

Referring now to FIG. 5, therein is shown the digit selection process subroutine which starts off at block 470 where switches 26, 28, 30, 32, 34, or 36 are turned on, the corresponding paired switch 27, 29, 31, 33, 35 or 37 is turned off. After a predetermined time delay as indicated by block 472 the first ladder switch 27 is turned on at block 474. The switch 27 is left on for a predetermined period as indicated by block 476 until the output of the D/A amplifier 11 output polarity is determined by block 478. If the polarity has changed, the switch 27 will be turned off at block 480 and if it has not it will be left on. In either event, the program will proceed through a further time delay as indicated by the block 482.

Next, the second ladder switch 29 will be turned on as indicated by block 484 and again after a predetermined time delay as indicated by block 486 a comparison will be made as indicated by decision block 490 to determine if there has been a polarity change of the A/D comparator/amplifier 40 output. This portion of the subroutine will be repeated for each of the ladder switches 31, 33, 35 and 37 until a polarity change occurs. If a polarity change occurs when a switch is turned on, that switch will be turned off and the program continued. With one final last time delay, the on or off condition of the ladder switches will be held in the FIFO buffer 312 as indicated by the block 496. Next the A capacitor or B capacitor will be allowed to reach its final value according to the bit switch states as indicated by block 498 and then the subroutine will return back to the main program at block 416, 438, 444, 450 or 456.

The memorization of the states in the FIFO occur five times during the preferred embodiment program at wave form points 524, 530, 538, 546, and 554.

In the digit selection process the various ladder switches are turned on to impose the corresponding ladder resistors and thus voltages to the amplifier 11 between wave form points 508 to 524; 528 to 530; 536 to 538; 544 to 546; and 552 to 554.

The tristate buffers 310 and the bus interface 70 transfer the data to the microprocesser 15. The data transfer is byte serial bit parallel and the bytes are transferred to the microprocessor 15 in the same order as they were generated: (first in, first out). In the preferred embodiment each byte contains six bits with each bit representing a ladder switch state.

The data transferred from the bus interface 70 to the microprocessor 15 has the following significance as shown in the table below:

| DATA PATTERN VS LADDER SWITCH ON | | | | | |
|---|---|---|---|---|---|
| | Sw27 | Sw29 | Sw31 | Sw33 | Sw35 | Sw37 |
| Byte 1 | $2^1$ | $2^0$ | $2^{-1}$ | $2^{-2}$ | $2^{-3}$ | $2^{-4}$ |
| Byte 2 | $2^{-3}$ | $2^{-4}$ | $2^{-5}$ | $2^{-6}$ | $2^{-7}$ | $2^{-8}$ |
| Byte 3 | $2^{-7}$ | $2^{-8}$ | $2^{-9}$ | $2^{-10}$ | $2^{-11}$ | $2^{-12}$ |
| Byte 4 | $2^{-11}$ | $2^{-12}$ | $2^{-13}$ | $2^{-14}$ | $2^{-15}$ | $2^{-16}$ |
| Byte 5 | $2^{-15}$ | $2^{-16}$ | $2^{-17}$ | $2^{-18}$ | $2^{-19}$ | $2^{-20}$ |

For every bit that is logic one in the data pattern transferred to the microprocessor 15, the microprocessor 15 adds a voltage multiplied by a power of 2 as shown in the above table, adjusted for known errors of the ladder resistors 19 through 25 and stored in the calibration memory 17.

The analog to digital conversion operations have been described above; however, to initialize the system, the microprocessor 15 calibrates the A/D converter by heuristically solving an 8 variable equation which represents the A/D analog circuitry. The exact method will be evident to those skilled in the art from the following analysis:

Definitions:

$V_{in}$ = input voltage;

$N_1$ thru $N_5$ = "Nibbles" or the closest approximation voltage which is subtracted at each iteration of the bit selection process;

$R_1$ thru $R_4$ = Remainder stored after each bit selection process;

$A_r$ = Remainder amplifier gain;

$A$ = Desired Gain;

$E$ = Gain error correction factor;

$A/K$ = Actual gain with K equal to $1+E$.

The first remainder stored is:

$$R_1 = A_r(V_{in} - N_1)$$

The second remainder stored is:

$$R_2 = A_r(R_1 - N_2) = A_r^2(V_{in} - N_1) - A_r N_2$$

The third remainder stored is:

$$R_3 = A_r(R_2 - N_3) = A_r^3(V_n - N_1) - A_r^2 N_2 - A_r N_3$$

The fourth remainder stored is:

$$R_4 = A_r^4(V_{in} - N_1) - A_r^3 N_2 - A_r^2 N_3 - A_r N_4$$

In the preferred embodiment, the last nibble $N_5$ is assumed equal to $R_4$ without sacrificing the accuracy necessary (i.e. remainder is discarded). Then solving for $V_{in}$:

$$A_r^4 V_{in} = A_r^4 N_1 + A_r^3 N_2 + A_r^2 N_3 + A_r N_4 + N_5$$

Therefore:

$$V_{in} = N_1 + N_2/A_r + N_3/A_r^2 + N_4/A_r^3 + N_5/A_r^4$$

If the gain A is not exactly right, the remainder stored and therefore the conversion result will be in error. Thus:

$$\text{A/D Result} = N_1 + KN_2/A + K^2 N_3/A^2 + K^4 N_4/A^3 + K^4 N_5/A^4$$

Where $K = 1 + E$, then:

$$K^2 = (1+E)^2 = 1 + 2E + E^2$$

$$K^3 = (1+E)^3 = 1 + 3E + 3E^2 + E^3$$

$$K^4 = (1+E)^4 = 1 + 4E + 6E^2 + 4E^3 + E^4$$

If it assumed that $E^2$, $E^3$, and $E^4$ are much less than 1 (since E is less than 1), then:

$$K = 1 + E$$

$$K^2 = 1 + 2E$$

$$K^3 = 1 + 3E$$

$$K^4 = 1 + 4E$$

By substitution:

A/D Result = $(N_1 + N_2/A + N_3/A^2 + N_4/A^3 + N_5/A^4)$ + $(EN_2/A + 2EN_3/A^2 + 3EN_4/A^3 + 4EN_5/A^4)$ In the above, the four terms in the second set of parenthesis are the total error.

The following equation will provide the A/D reading or result in the preferred embodiment when all of the variables are substituted with the correct numerical values:

A/D result = $Z$ +

$16^0[-(1-a)(L1) + b(L2) + c(L3) + d(L4) + e(L5) + f(L6)]$ +

$(1+E)/16^1[-(1-g)(L1) + h(L2) + i(L3) + j(L4) + k(L5) + l(L6)]$ +

$(1+2E)/16^2[-(1-m)(L1) + n(L2) + o(L3) + p(L4) + q(L5) + r(L6)]$ +

$(1+3E)/16^3[-1(1-s)(L1) + t(L2) + u(L3) + v(L4) + w(L5) + x(L6)]$ +

$(1+4E)/16^4[-(1-y)(L1) + z(L2) + G(L3) + H(L4) + I(L5) + J(L6)]$

Where:
a, b, c, ... h, i, j, = switch selection patterns are (value 0 or 1)
L1, L2, L3, L4, L5, L6 = actual ladder bit values—Ideally
L1=2, L2=1, L3=0.5, L4=0.25, L5=0.125, L6=0.0625
Z = offset, ideally equal to zero.

The values of L1, L2, L3, L4, L5, L6, E, and Z are nominally known and therefore, in an implementation of the A/D converter, inputs can be chosen so that specific switch selection patterns can be selected as needed. During calibration, known values of input are applied to the A/D converter and the exact values for each of the variables L1, L2, L3, L4, L5, L6, E, and Z can be empirically determined.

In the preferred embodiment, the A/D result is dependent on all of the terms of the above equation, however in the process of determining the values of the variables only the first two terms are specifically considered in the iterative program to arrive at the exact values. In practice only the difference or "error" between the real value and the ideal value is stored in the calibration memory 17.

When the A/D converter is used to make a measurement, the switch selection patterns are determined by the hardware. These pattern values are then substituted in the equation with the actual ladder values combined with the correction factors (errors), the E value, and the Z value to arrive at the final A/D result.

From the above, it will be evident that whenever a system is to be calibrated either at the factory or in the field, known external calibration signals having specific levels are imposed on the system. With the external signals intended to exercise certain bits in the system, the difference between the calibration and outputted digital signals will provide the data for determining the constants in the multivariable equation. When the calibration device (not shown) is subject to computer control as to the signal levels it outputs and when, the microprocessor 15 can also be computer controlled to initiate its calibration cycle to allow remote automatic calibration of the system.

As many possible embodiments may be made of the invention without departing from the scope thereof, it is to be understood that all matters set forth herein and shown in the accompanying drawings are to be interpreted in an illustrative and not a limiting sense.

I claim:

1. A circuit connectable to first and second voltage sources for supplying to a first amplifier means first and second regulated supply voltages, comprising:
   first and second transistor means connected in series between said first and second voltage sources and having outputs supplying respectively said first and second regulated supply voltages;
   first and second voltage regulator devices connected in series between said voltage sources, said regulator devices having a substantially constant voltage drop as a function of at least a threshold current flowing therethrough, outputs of said voltage regulator devices controlling respectively said first and second transistor means;
   a second amplifier means for controlling an input of said first and second regulator devices;
   first means for applying an input signal to non-inverting inputs of said first and second amplifier means; and
   second means for applying an output of said first amplifier means to an inverting input of said second amplifier means;
   whereby the supply voltages track input signals applied to said second amplifier means to eliminate a common mode signal from the output of said first amplifier means.

2. The circuit of claim 1, wherein said second means includes voltage limiter means for limiting the magnitude of the signal applied by said first amplifier means to said second amplifier means, whereby the magnitude of said first and second regulated supply sources are limited to prevent saturation of said second amplifier means.

3. The circuit of claim 1, wherein said regulator devices comprise Zener diodes.

4. The circuit of claim 3, wherein said limiter means comprises a pair of Zener diodes connected back-to-back.

5. The circuit of claim 3, wherein the output of said first amplifier means is connected to a junction between said Zener diodes.

6. The circuit of claim 1, including a capacitor connected between said first and second transistor means.

7. The circuit of claim 6, wherein said transistor means are connected as emitter followers.

8. The circuit of claim 6, including means for applying a reference signal to a non-inverting input of said second amplifier means.

9. The circuit of claim 8, including a capacitor connected in series between said reference signal means and said second amplifier means.

10. The circuit of claim 9, including means for operating said first amplifier means selectively as an amplifier and a comparator, said limiter means preventing saturation of said second amplifier means operated as a comparator.

11. The circuit of claim 10, wherein said reference signal means includes a ladder network of a recirculation of remainder type digital to analog converter.

* * * * *